(12) United States Patent
Ito

(10) Patent No.: US 10,374,537 B2
(45) Date of Patent: Aug. 6, 2019

(54) ROTOR POSITION DETECTION SYSTEM

(71) Applicants: Kabushiki Kaisha Toshiba, Minato-ku, Tokyo (JP); Toshiba Electronic Devices & Storage Corporation, Minato-ku, Tokyo (JP)

(72) Inventor: Tamotsu Ito, Yokohama Kanagawa (JP)

(73) Assignees: Kabushiki Kaisha Toshiba, Tokyo (JP); Toshiba Electronics Devices & Storage Corporation, Tokyo (JP)

(*) Notice: Subject to any disclaimer, the term of this patent is extended or adjusted under 35 U.S.C. 154(b) by 0 days.

(21) Appl. No.: 15/883,621

(22) Filed: Jan. 30, 2018

(65) Prior Publication Data

US 2019/0058424 A1    Feb. 21, 2019

(30) Foreign Application Priority Data

Aug. 18, 2017    (JP) .................................. 2017-158223

(51) Int. Cl.
| | |
|---|---|
| H02P 6/16 | (2016.01) |
| H02P 8/38 | (2006.01) |
| G01R 19/175 | (2006.01) |
| H03K 5/1536 | (2006.01) |
| H02P 6/18 | (2016.01) |

(52) U.S. Cl.
CPC .............. *H02P 8/38* (2013.01); *G01R 19/175* (2013.01); *H02P 6/18* (2013.01); *H03K 5/1536* (2013.01)

(58) Field of Classification Search
CPC ... H02P 6/182; H02P 6/16; H02P 6/18; G01R 19/175; H03K 5/1536
See application file for complete search history.

(56) References Cited

U.S. PATENT DOCUMENTS

| | | | | | |
|---|---|---|---|---|---|
| 5,886,484 | A | * | 3/1999 | Fucili ....................... | H02P 7/04 318/400.25 |
| 6,049,184 | A | * | 4/2000 | Uggla ....................... | H02P 8/12 318/254.2 |
| 6,879,128 | B2 | * | 4/2005 | Coutu ....................... | H02P 8/12 318/599 |
| 7,560,893 | B2 | * | 7/2009 | Thomson .................. | H02P 8/12 318/400.11 |
| 8,174,223 | B2 | | 5/2012 | Takada et al. | |
| 8,508,175 | B2 | | 8/2013 | Hioki | |
| 8,896,257 | B2 | * | 11/2014 | Takada ...................... | H02P 8/38 318/685 |
| 9,595,898 | B1 | | 3/2017 | Inoue et al. | |

FOREIGN PATENT DOCUMENTS

| | | |
|---|---|---|
| JP | 2000-134981 A | 5/2000 |
| JP | 2009-207260 A | 9/2009 |
| JP | 2011-067061 A | 3/2011 |
| JP | 5331370 B2 | 10/2013 |
| JP | 2017-041951 A | 2/2017 |

\* cited by examiner

*Primary Examiner* — Thai T Dinh
(74) *Attorney, Agent, or Firm* — White & Case LLP

(57) ABSTRACT

A rotor position detection system according to one embodiment includes a H bridge circuit, a current detection circuit, a time measurement circuit, a zero cross determination circuit, and a rotor position calculation circuit. The zero cross determination circuit calculates a zero cross position of the induced voltage of the motor based on a difference time calculated by the time measurement circuit. The rotor position calculation circuit calculates a rotor position of the motor based on the zero cross position of the induced voltage.

17 Claims, 15 Drawing Sheets

FIG. 4A

|  | HST1 | LST1 | HST2 | LST2 |  |
|---|---|---|---|---|---|
| OPERATING STATE (I) | "ON" | "OFF" | "OFF" | "ON" | CURRENT FLOW (Vm→HST1→MOTOR 3→LST2→Vss) |
| OPERATING STATE (II) | "OFF" | "ON" | "ON" | "OFF" | CURRENT FLOW (Vm→HST2→MOTOR 3→LST1→Vss) |
| OPERATING STATE (III) | "OFF" | "ON" | "OFF" | "ON" | FORMATION OF DISCHARGE PASS FROM MOTOR 3 TO VSS |

FIG. 4B

| OPERATING STATE (I) →OPERATING STATE (III) | CURRENT FLOW (MOTOR 3→LST2→Vss→LST1) |
|---|---|
| OPERATING STATE (II) →OPERATING STATE (III) | CURRENT FLOW (MOTOR 3→LST1→Vss→LST2) |

ROTOR POSITION DETECTION SYSTEM

CROSS REFERENCE TO RELATED APPLICATION

This application is based upon and claims the benefit of priority from the prior Japanese Patent Application No. 2017-158223, filed on Aug. 18, 2017, the entire contents of which are incorporated herein by reference.

FIELD

An embodiment described herein relate to a rotor position detection system.

BACKGROUND

When driving a motor such as a DC motor and a stepping motor with high efficiency, a motor current is controlled by a pulse width modulation (PWM) control. In a motor drive system, it is important to detect a rotor position.

A voltage, a polarity and an inclination change with a wave height value and a phase delay amount of an induced voltage of a first phase and an induced voltage of a second phase, when the stepping motor detects an induced voltage in an interval where a motor control current does not flow, and detects a rotor position based on information of the voltage, the polarity, the inclination and the like. Therefore, there is a problem that it is difficult to detect the rotor position.

BRIEF DESCRIPTION OF THE DRAWINGS

FIG. 4A is a view showing operation states I, II and III of an H bridge circuit according to the first embodiment, FIG. 4B is a diagram showing the operation state I→the operation state III, the operation state II→the operation state III of the H bridge circuit according to the first embodiment;

DETAILED DESCRIPTION

Figure 1:
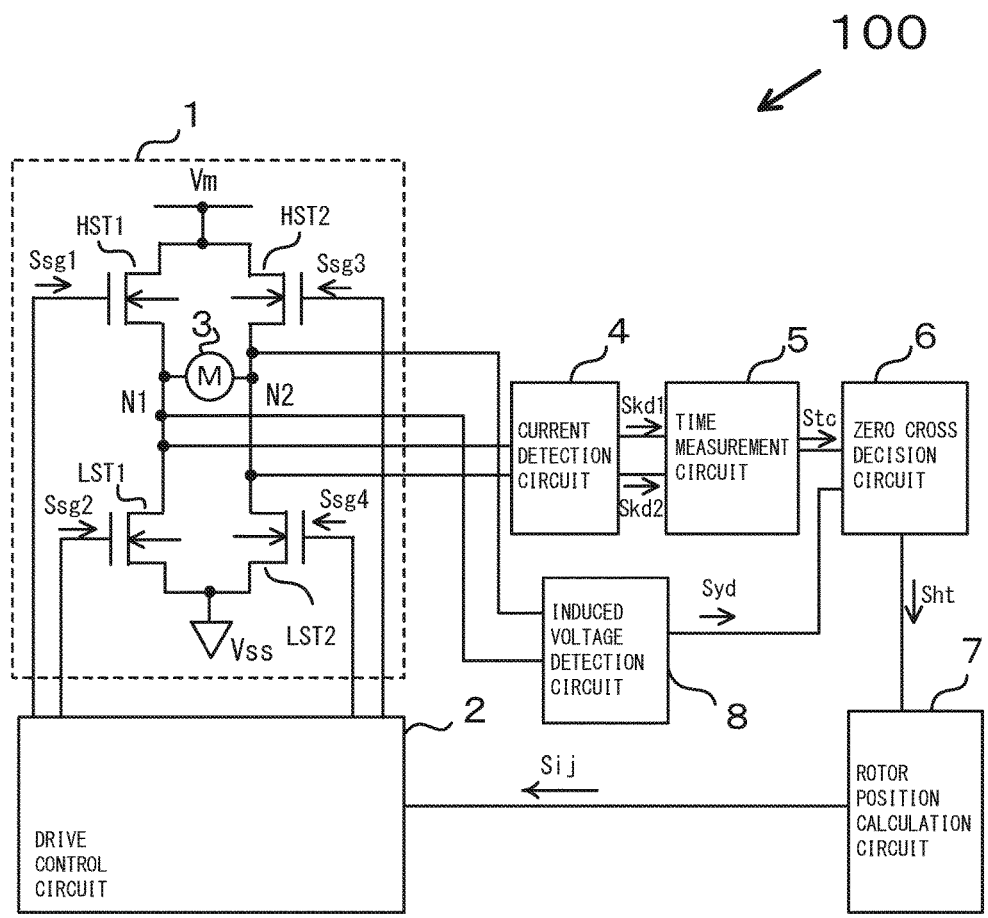
FIG. 1 is a circuit diagram showing a rotor position detection system according to a first embodiment.

A rotor position detection system according to one embodiment includes a H bridge circuit, a current detection circuit, a time measurement circuit, a zero cross determination circuit, and a rotor position calculation circuit. The H bridge circuit includes a first high side transistor and a second high side transistor that control a direction and a conduction of a current flowing through a coil of a motor provided between a power supply and the motor, and a first low side transistor and a second low side transistor provided between the motor and a ground potential. The current detection circuit detects a current flowing from the motor to the first low side transistor or the second low side transistor when the first and second high side transistors are turned off and the first and second low side transistors are turned on, and converts the detected current into a voltage. The time measurement circuit measures a first time until a detection voltage detected by the current detection circuit becomes lower than a first reference voltage, and a second time until the detection voltage becomes lower than a second reference voltage which is smaller than the first reference voltage, and calculates a difference time between the first time and the second time. The zero cross determination circuit calculates a zero cross position of the induced voltage of the motor based on the difference time. The rotor position calculation circuit calculates the rotor position of the motor based on the zero cross position of the induced voltage.

Hereinafter, a plurality of further embodiments will be described with reference to the drawings. In the drawings, the same reference numerals indicate the same or similar portions.

Figure 2:
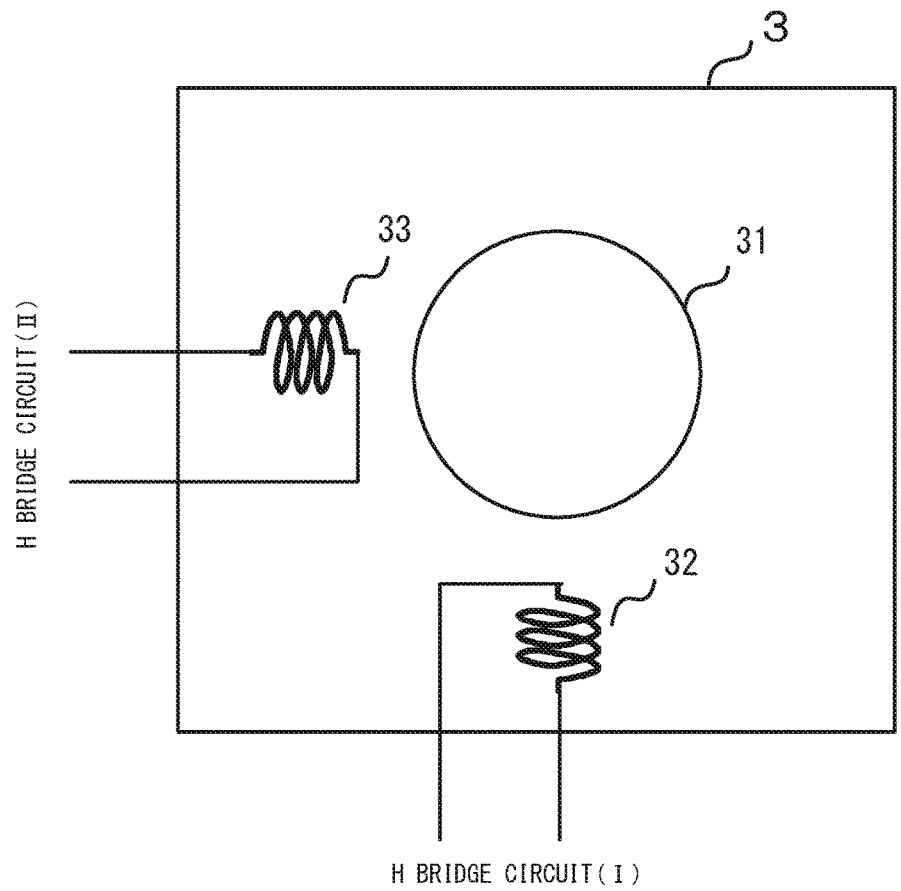
FIG. 2 is a schematic diagram illustrating an internal configuration of a stepping motor according to the first embodiment.

A rotor position detection system according to a first embodiment will be described with reference to the drawings. FIG. 1 is a circuit diagram showing the rotor position detection system. FIG. 2 is a schematic diagram illustrating an internal configuration of a stepping motor. In the present embodiment, a rotor position is calculated by detecting a current flowing from the motor to the first low side transistor or the second low side transistor when the first and second high side transistors are turned off and the first and second low side transistors are turned on, and measuring the time during which the amount of current changes.

As shown in FIG. 1, a rotor position detection system 100 includes an H bridge circuit 1, a drive control circuit 2, a current detection circuit 4, a time measurement circuit 5, a zero cross determination circuit 6, a rotor position calculation circuit 7, and an induced voltage detection circuit 8. The rotor position detection system 100 executes drive control of a motor 3 and calculation of the rotor position.

As shown in FIG. 2, the motor 3 is a stepping motor including a rotor 31, a first phase coil 32, and a second phase coil 33. The motor 3 is applied for a game machine, a printer, a computer, a digital camera, an industrial robot, and the like. The first phase coil 32 and the second phase coil 33 are provided on an outer peripheral side of the rotor 31. The first phase coil 32 is connected to an H bridge circuit (I), and the second phase coil 33 is connected to an H bridge circuit (II).

In FIG. 1, for simplicity of explanation, only one phase of the H bridge circuit is displayed. For the H bridge circuit (II), a current detection circuit, a time measurement circuit, a zero cross determination circuit, a rotor position calculation circuit, and an induced voltage detection circuit are additionally required. The current detection circuit, the time measurement circuit, the zero cross determination circuit, the rotor position calculation circuit, and the induced voltage detection circuit are not shown here for the sake of simplicity.

The drive control circuit 2 outputs control signals Ssg1 to Ssg4 to the H bridge circuit 1 to drive and control the H bridge circuit 1. Control signals Ssg1 to Ssg4 are a pulse width modulation (PWM) signal whose duty is variable.

The H bridge circuit 1 includes a high side transistor HST1, a high side transistor HST2, a low side transistor LST1, and a low side transistor LST2. The H bridge circuit 1 is PWM controlled and generates a current to drive the motor 3.

The high side transistor HST1 (a first high side transistor) is an N-channel power MOS transistor. The high side transistor HST1 has one end (drain) connected to a power supply (a high potential side power supply) Vm, and the other end (source) connected to a node N1 and one end of a motor M3, and the control signal Ssg1 is input to a control terminal (gate).

The high side transistor HST2 (a second high side transistor) is an N-channel power MOS transistor. The high side transistor HST2 has one end (drain) connected to the power supply (the high potential side power supply) Vm, and the other end (source) connected to a node N2 and the other end of the motor M3, and the control signal Ssg3 is input to the control terminal (gate).

The low side transistor LST1 (a first low side transistor) is an N-channel power MOS transistor. The low side transistor LST1 has one end (drain) connected to a node N1 and one end of the motor M3, and the other end connected to a ground potential (a low potential side power supply) Vss, and the control signal Ssg2 is input to the control terminal (gate).

The low side transistor LST2 (a second low side transistor) is an N-channel power MOS transistor. The low side transistor LST2 has one end (drain) connected to a node N2 and the other end of the motor M3, and the other end connected to a ground potential (the low potential side power supply) Vss, and the control signal Ssg4 is input to the control terminal (gate).

The induced voltage detection circuit 8 detects an induced voltage generated across the motor 3. For example, the induced voltage detection circuit 8 has one end connected between the high side transistor HST2 and the other end of the motor 3, and the other end connected between one end of the motor 3 and the low side transistor LST1.

Figure 3:
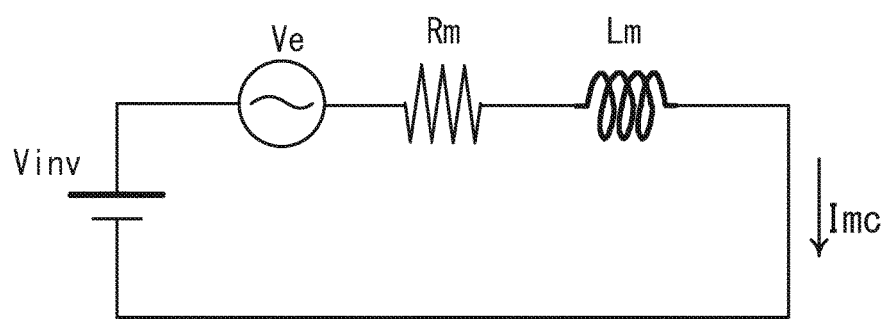
FIG. 3 is an equivalent circuit diagram for one phase according to the first embodiment.

Next, an equivalent circuit of the stepping motor 3 will be described with reference to the drawings. FIG. 3 is a diagram showing one phase of the equivalent circuit of the stepping motor 3.

The equivalent equation of the stepping motor 3 can be expressed as an expression (1) of $Vinv-Ve=(Rm \times Imc)+\{Lm \times (di/dt)\}$. Here, Vinv is a power supply voltage (a voltage of a power supply m), Ve is an induced voltage, Rm is an internal resistance (motor constant) of the motor 3, Lm is an inductance (motor constant) of the coil of the motor 3, di is a control current variation per unit time, and dt is unit time.

Here, the operation state of the H bridge circuit 1 will be described with reference to FIGS. 4 and 5.

FIG. 4A is a view showing operation states I, II and III of an H bridge circuit, and FIG. 4B is a diagram showing the operation state I→the operation state III, the operation state II→the operation state III of the H bridge circuit. FIG. 5 is a diagram showing a flow of a motor current in the operation state I→the operation state III of the bridge circuit.

As shown in FIG. 4A, in the operation state I, the high side transistor HST1 and the low side transistor LST2 are turned on and the high side transistor HST2 and the low side transistor LST1 are turned off. In the operation state I, a current is supplied from the power supply Vm to the motor 3 via the high side transistor HST1.

In the operation state II, the high side transistor HST2 and the low side transistor LST1 are turned on and the high side transistor HST1 and the low side transistor LST2 are turned off. In the operation state II, a current is supplied from the power supply Vm to the motor 3 via the high side transistor HST2.

In the operation state III, the high side transistor HST1 and the high side transistor HST2 are turned off and the low side transistor LST1 and the low side transistor LST2 are turned on. In the operation state III, the charge accumulated in the coil of the motor 3 is discharged and a current flows in the direction of the ground potential Vss. The operation state III is also called Slow Decay.

Note that when the high side transistor HST1 and the low side transistor LST1 are simultaneously turned on or the high side transistor HST2 and the low side transistor LST2 are simultaneously turned on, a large current flows from the power supply Vm to the ground potential Vss side, so that significant damage occurs in the internal circuit of the rotor position detection system 100. Therefore, an operation mode in which the high side transistor HST1 and the low side transistor LST1 are simultaneously turned on or the high side transistor HST2 and the low side transistor LST2 are simultaneously turned on is not set.

Figure 5:
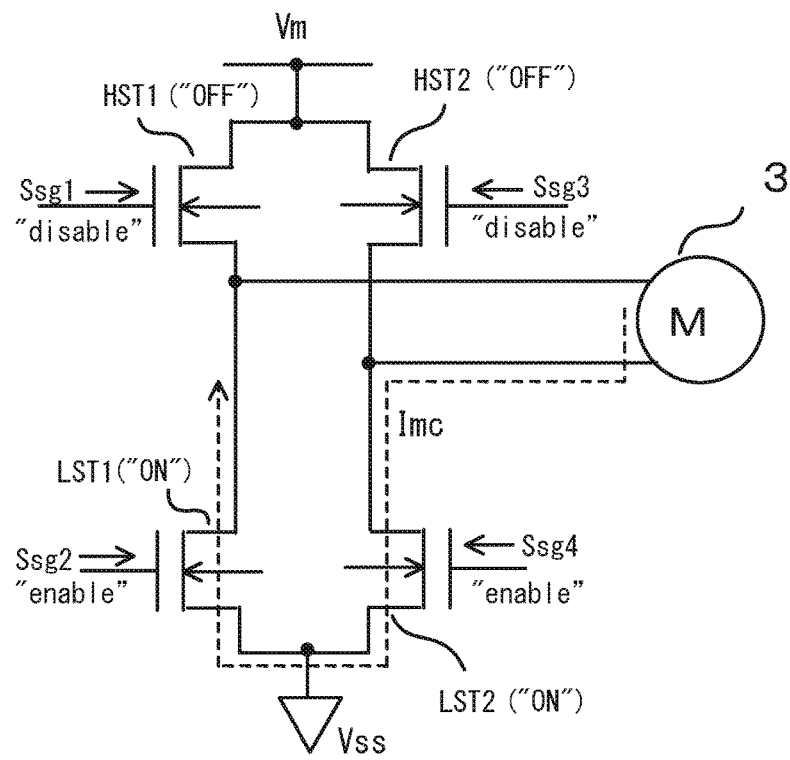
FIG. 5 is a diagram showing a flow of a motor current in the operation state I→the operation state III of the bridge circuit according to the first embodiment.

As shown in FIG. 4B, when the operation state changes from the operation state I to the operation state III, as shown in FIG. 5, a motor current Imc flows from the motor 3 to the low side transistor LST2. When the operation state changes from the operation state II to the operation state III, the motor current Imc flows from the motor 3 to the low side transistor LST1.

Here, since Vinv=0 (zero) V in the state changed from the operation state I to the operation state III, expression (1) can be expressed as an expression (2) of $-Ve=(Rm \times Imc)+\{Lm \times (di/dt)\}$. It should be noted that the same applies to a state expression changed from the operation state II to the operation state III. When the expression (2) is transformed, an expression (3) of $dt=(Lm \times di)/[-(Ve+(Rm \times Imc))]$ is satisfied.

In a step interval of the stepping motor where $\Delta Ve \gg (Rm \times \Delta Imc)$ is satisfied, by controlling a di (current change amount per unit time) to a constant amount, it is possible to extract the change of an induced voltage Ve as a change of dt (unit time).

When the expression (3) is transformed, an expression (4) of $di=[-(Ve+(Rm \times Imc))]/Lm$ is satisfied. Here, when dt (unit time) is fixed, a change in the induced voltage Ve can be extracted as a change amount of di (current change amount per unit time).

Figure 6:
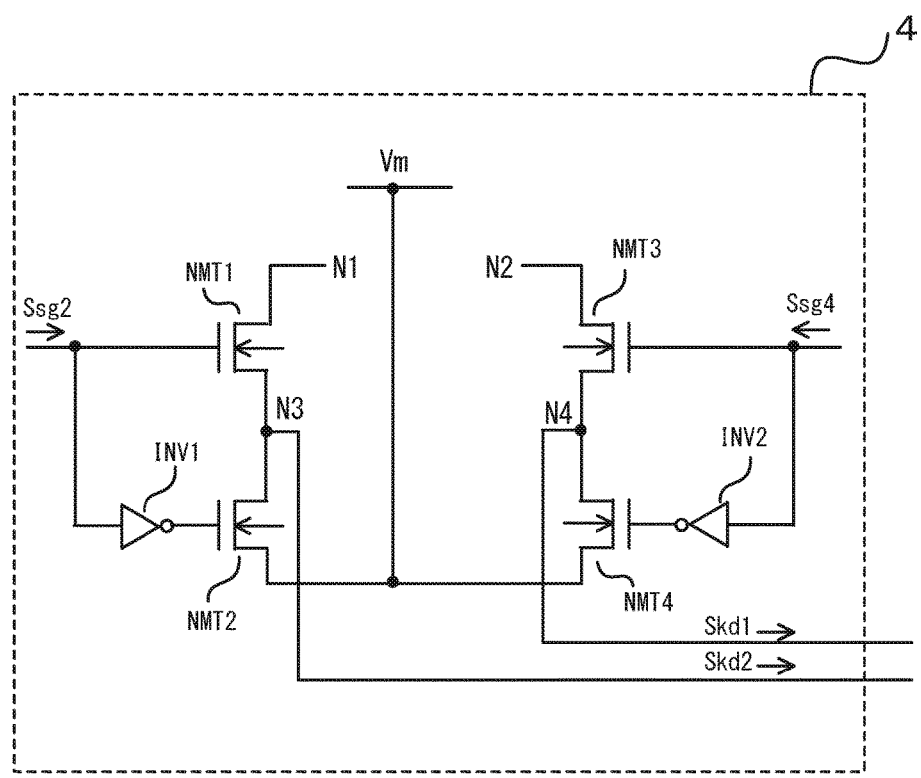
FIG. 6 is a circuit diagram showing a current detection circuit according to the first embodiment.

The current detection circuit 4 detects a current flowing through the node N1 and a current flowing through the node N2 and outputs the current flowing through the node N1 and the current flowing through the node N2 as the detected voltage. As shown in FIG. 6, the current detection circuit 4 includes an inverter INV1, an inverter INV2, and MOS transistors NMT1 to NMT4.

The MOS transistor NMT1 is an N-channel MOS transistor. The MOS transistor NMT1 has one end (drain) connected to the node N1, and the other end (source) connected to a node N3, and the control signal Ssg2 is input to the control terminal (gate).

The MOS transistor NMT2 is an N-channel MOS transistor. The MOS transistor NMT2 has one end (drain) connected to the node N3, and the other end (source) connected to the power supply (the high potential side power supply) Vm, and the control signal Ssg2 is input to the control terminal (gate) via the inverter INV1. An inverted signal of the control signal Ssg2 is input to the control terminal (gate) of the MOS transistor NMT2.

The MOS transistor NMT3 is an N-channel MOS transistor. The MOS transistor NMT3 has one end (drain) connected to the node N2, and the other end (source) connected to a node N4, and the control signal Ssg4 is input to the control terminal (gate).

The MOS transistor NMT4 is an N-channel MOS transistor. The MOS transistor NMT4 has one end (drain) connected to the node N4, and the other end (source) connected to the power supply (the high potential side power supply) Vm, and the control signal Ssg4 is input to the control terminal (gate) via the inverter INV2. An inverted signal of the control signal Ssg4 is input to the control terminal (gate) of the MOS transistor NMT4.

A detection signal Skd2 is output from the node N3 to the time measurement circuit 5 and a detection signal Skd1 is output from a node N4 to the time measurement circuit 5.

Figure 7:
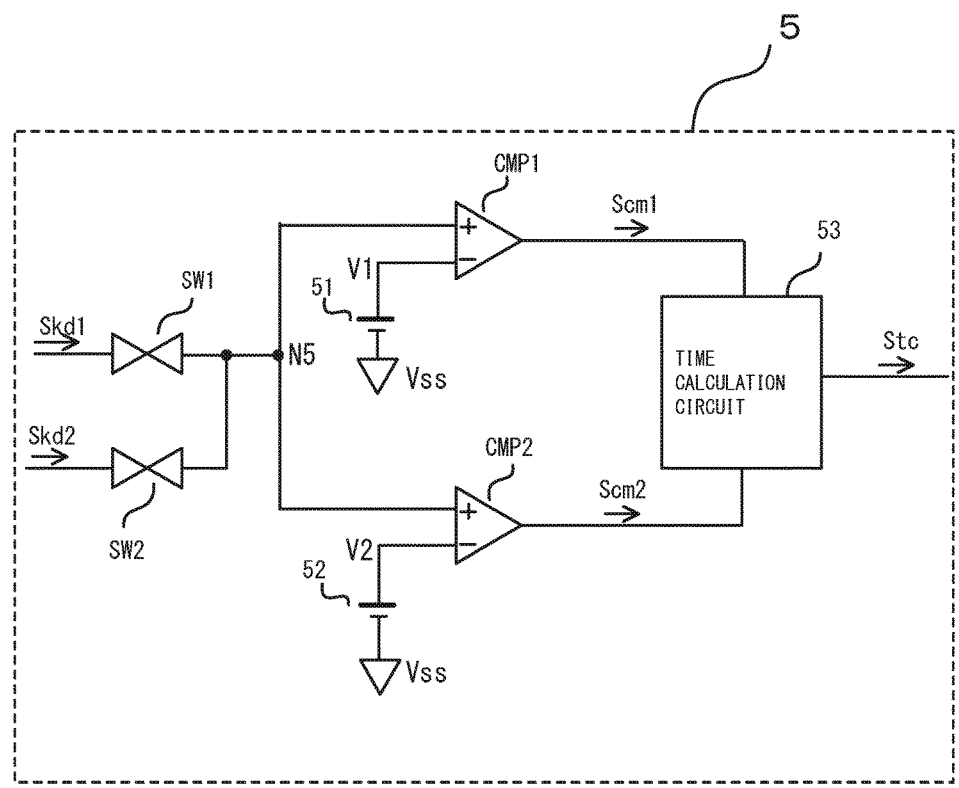
FIG. 7 is a circuit diagram showing a time measurement circuit according to the first embodiment.

As shown in FIG. 7, the time measurement circuit 5 includes a reference voltage generating circuit 51, a reference voltage generating circuit 52, a time calculation circuit 53, a comparator CMP1, a comparator CMP2, a switch SW1, and a switch SW2.

When the high side transistor HST1 and the high side transistor HST2 of the H bridge circuit 1 are turned off, and the low side transistor LST1 and the low side transistor LST2 are turned on, for example, in the state changed from the operation state I to the operation state III, the time measurement circuit 5 measures a first time until the detection voltage becomes lower than the first reference voltage and a second time until the detection voltage becomes lower than the second reference time which is smaller than the first reference time, and calculates a difference time (as a unit time dt) between the first time and the second time.

The switch SW1 is a single pole single throw (SPST) switch. The switch SW1 causes the detection signal Skd1 to flow to a node N5 or blocks the detection signal Skd1 based on a control signal (not shown). The switch SW2 is a SPST switch. The switch SW2 passes or interrupts the detection signal Skd2 to the node N5 based on a control signal (not shown). In the state changed from the operation state I to the operation state III, the switch SW1 is turned on and the switch SW2 is turned off.

The reference voltage generating circuit 51 is provided between a minus (−) port on the input side of the comparator CMP1 and the ground potential (the low-potential side power supply) Vss, and generates a reference voltage V1 (a first reference voltage). The reference voltage V1 is a reference value obtained by converting a micro step current into a voltage. Specifically, the reference voltage V1 is a value of (a micro step current value)×(on resistance (Ron) of the low side transistors LST1 and LST2).

The reference voltage generating circuit 52 is provided between a minus (−) port on the input side of the comparator CMP2 and the ground potential (the low-potential side power supply) Vss, and generates a reference voltage V2 (a second reference voltage). The reference voltage V2 is a reference value obtained by converting a ripple amount of the micro step current into a voltage. Specifically, the reference voltage V2 is a value of (the ripple amount of the micro step current)×(on resistance (Ron) of the low side transistors LST1 and LST2). The reference voltage V1 is a value larger than the reference voltage V2.

In the comparator CMP1, a plus (+) port on the input side is connected to the node N5, the reference voltage V1 is applied to a minus (−) on the input side, and a comparison signal Scm1 subjected to comparison operation processing is output.

In the comparator CMP2, a plus (+) port on the input side is connected to the node N5, the reference voltage V2 is applied to a minus (−) on the input side, and a comparison signal Scm2 subjected to comparison operation processing is output.

Figure 8:
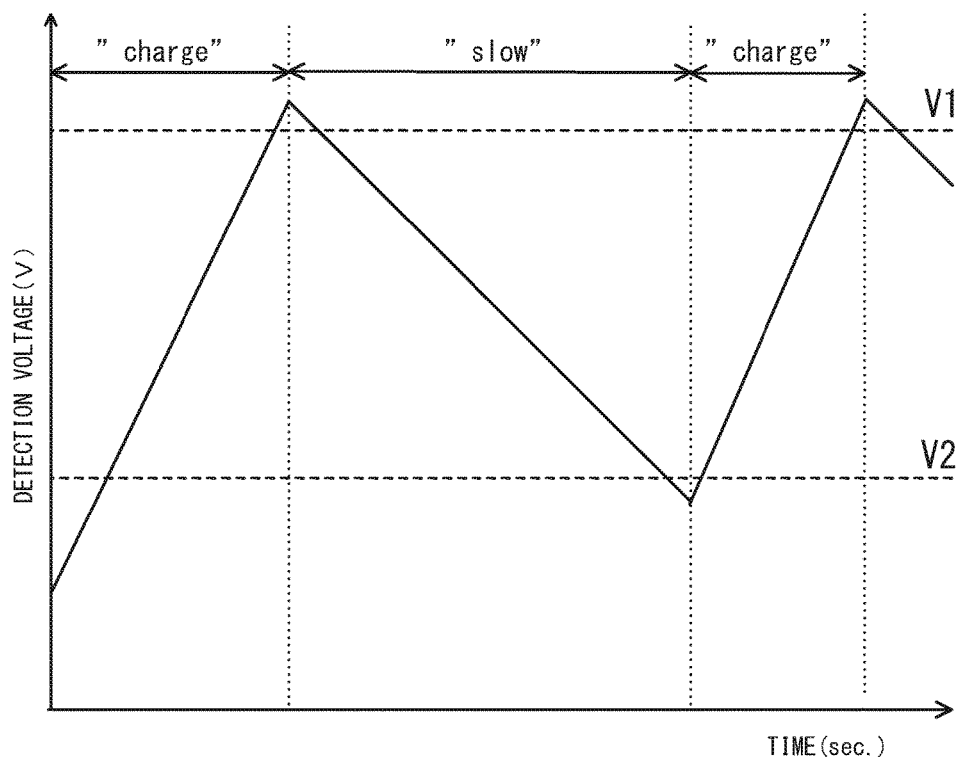
FIG. 8 is a view showing a change in a detected voltage according to the first embodiment.

The change in the detection voltage detected by the current detection circuit 4 will be described with reference to FIG. 8. As shown in FIG. 8, in a period ("charge" period) during which the motor current Imc is supplied to the motor 3, the detected voltage is boosted from a state lower than the reference voltage V2 to a voltage higher than the reference voltage V1. In a period ("slow" period) during which the electric charge accumulated in the motor 3 is discharged to the ground potential Vss side, the detected voltage is stepped down from a state higher than the reference voltage V1 to a voltage lower than the reference voltage V2.

Figure 9:
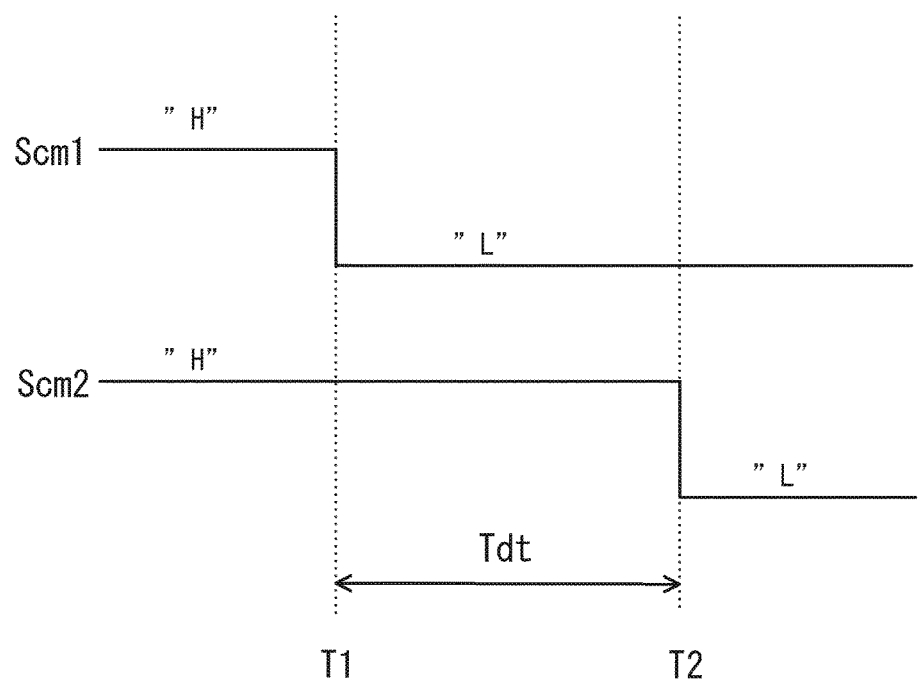
FIG. 9 is a view showing an operation of a time calculation circuit according to the first embodiment.

The time calculation circuit 53 receives the comparison signal Scm1 and the comparison signal Scm2, and outputs a calculation signal Stc. As shown in FIG. 9, the time calculation circuit 53 measures a time T1 (a first time) until the comparison signal Scm1 changes from "High" level to "Low" level and a time T2 (a second time) until the comparison signal Scm2 changes from "High" level to "Low" level), calculates a difference time between the time T1 (the first time) and the time T2 (the second time) as the dt time Tdt, and outputs the dt time Tdt as the calculation signal Stc.

The zero cross determination circuit 6 receives the calculation signal Stc (difference time information) output from the time measurement circuit 5 and a detection signal Syd (induced voltage information) output from the induced voltage detection circuit 8, thereby calculating the zero cross position of the motor 3.

Figure 15:
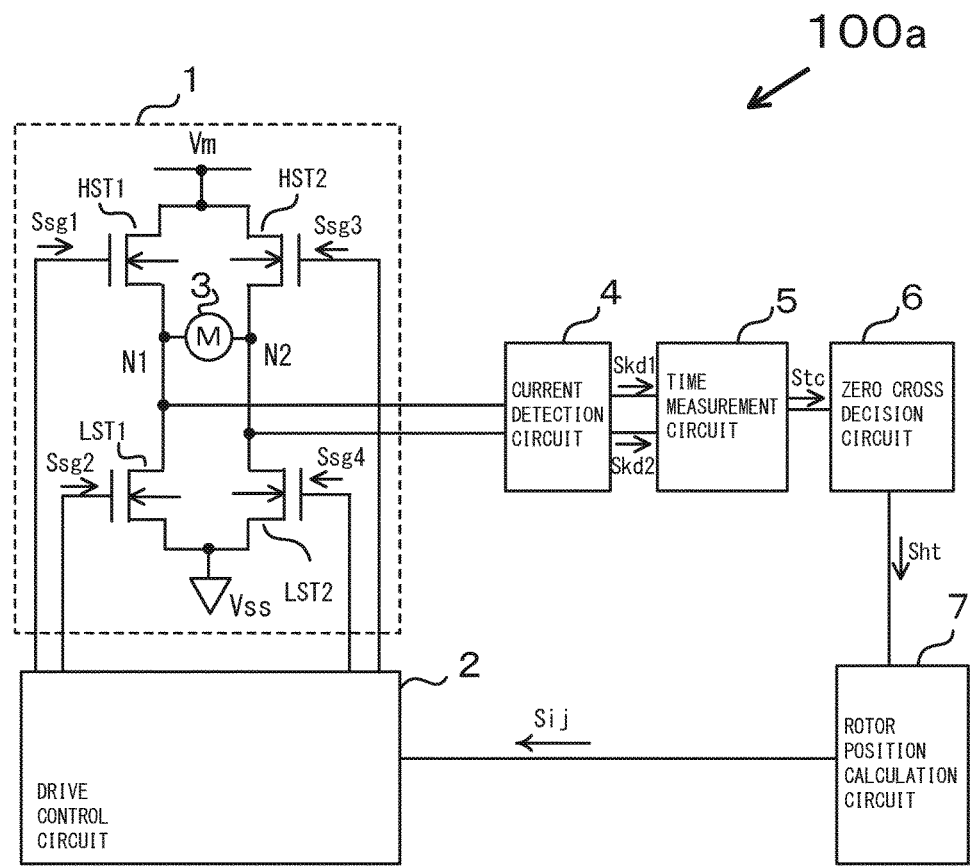
FIG. 15 is a circuit diagram showing a rotor position detection system in a first modification.

Here, the zero cross determination circuit 6 receives the calculation signal Stc and the detection signal Syd and uses the detection signal Syd (induced voltage information) as an auxiliary. However, only the calculation signal Stc may be input to the zero cross determination circuit 6 without using the detection signal Syd as in the rotor position detection system 100a of a first modification shown in FIG. 15.

Specifically, since the induced voltage Ve=0 (zero) at the zero cross position of the induced voltage in the equation (3), an expression (5) of dt=(Lm×di)/[−(Rm×Imc)] is satisfied.

Here, di (current change amount per unit time) is controlled by the proportion of the motor current Imc (proportional value A). For example, if control is performed with an expression (6) of di:Imc=A:1, an expression (7) of dt=(Lm×A)/[−(Rm)] is satisfied.

Figure 10:
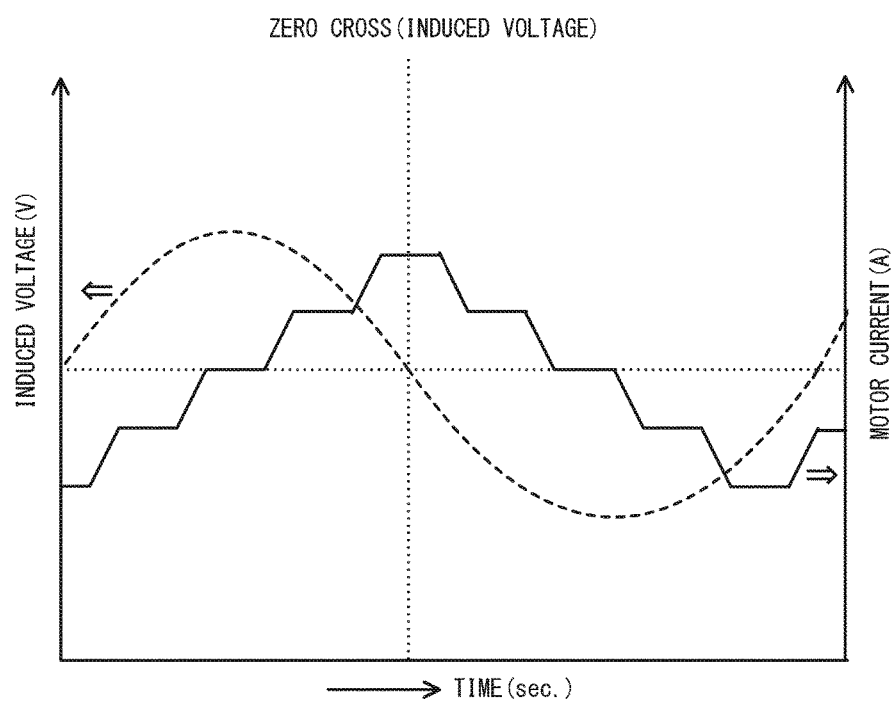
FIG. 10 is a view showing rotor position detection according to the first embodiment.

Here, Rm is the internal resistance of the motor 3, Lm is the inductance of the coil of the motor 3, and Rm and Lm are constants peculiar to the motor. Therefore, as shown in FIG. 10, it is found that a position where the dt time Tdt (Slow decay time) as the difference time is equal to the expression (7) is the zero cross position of the induced voltage.

The rotor position calculation circuit 7 receives a determination signal Sht (zero cross position information) output from the zero cross determination circuit 6, and calculates the rotor position. The rotor position calculation circuit 7 outputs a rotor position information signal Sij to the drive control circuit 2. The drive control circuit 2 controls the motor control current amount based on the rotor position information signal Sij.

Figure 11:
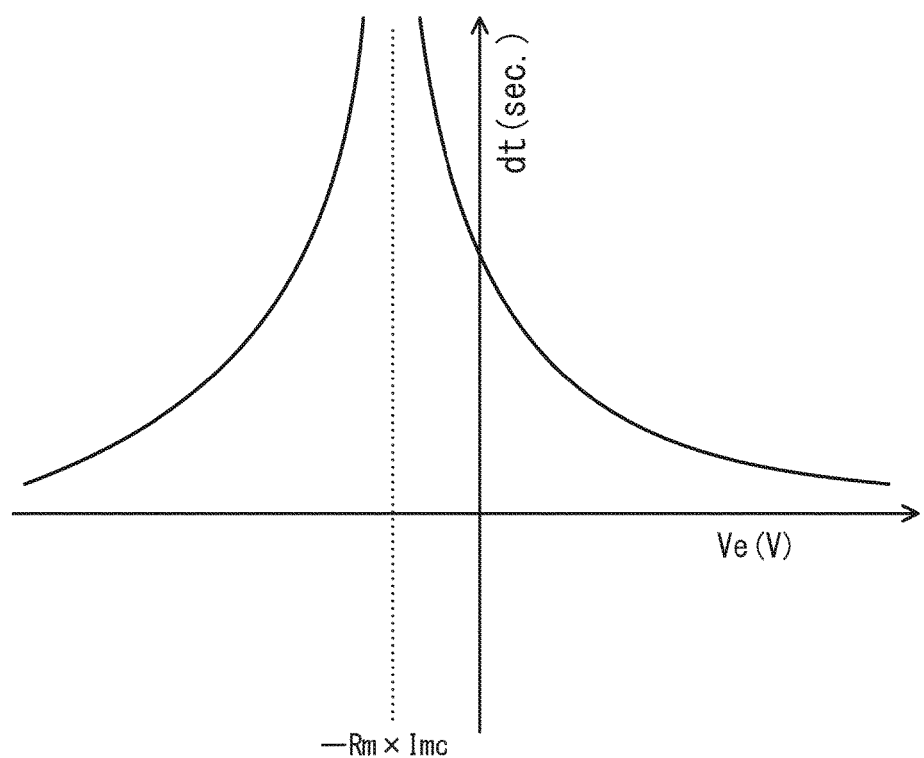
FIG. 11 is a view for explaining rotor position detection in a second modification.

In expression (3), the denominator of the region where $-Ve=(Rm\times Imc)$ is zero. Therefore, as shown in FIG. 11, when Ve is $(-Rm\times Imc)$, the unit time dt (difference time) is maximal. For this reason, the change of the induced voltage Ve in the region where $|Ve|>>(Rm\times Imc)$ can be extracted as the change of the unit time dt (difference time). Therefore, it is possible to calculate the zero cross position as the first modification.

As described above, in the rotor position detection system 100 of the present embodiment, the H bridge circuit 1, the drive control circuit 2, the current detection circuit 4, the time measurement circuit 5, the zero cross determination circuit 6, the rotor position calculation circuit 7, and the induced voltage detection circuit 8 are provided. The H bridge circuit 1 includes the high side transistor HST1, the high side transistor HST2, the low side transistor LST1, and the low side transistor LST2. The motor 3 has one end connected between the high side transistor HST1 and the low side transistor LST1 (node N1), and the other end connected between the high side transistor HST2 and the low side transistor LST2 (node N2). When the high side transistors HST1 and HST2 are turned off and the low side transistors LST1 and LST2 are turned on, the current detection circuit detects the current flowing from the motor 3 side to the reference potential Vss as a detection voltage. The time measurement circuit 5 calculates the unit time dt (difference time) based on the detected voltage, the reference voltage V1, and the reference voltage V2 smaller than the reference voltage V1. The zero cross determination circuit 6 calculates a zero cross position of the induced voltage of the motor 3 based on the unit time dt (difference time). The rotor position calculation circuit 7 calculates the rotor position based on the zero cross position.

Therefore, the rotor position can be detected even when voltage, polarity, and inclination change to the wave height value and phase delay amount of the induced voltage.

Figure 12:
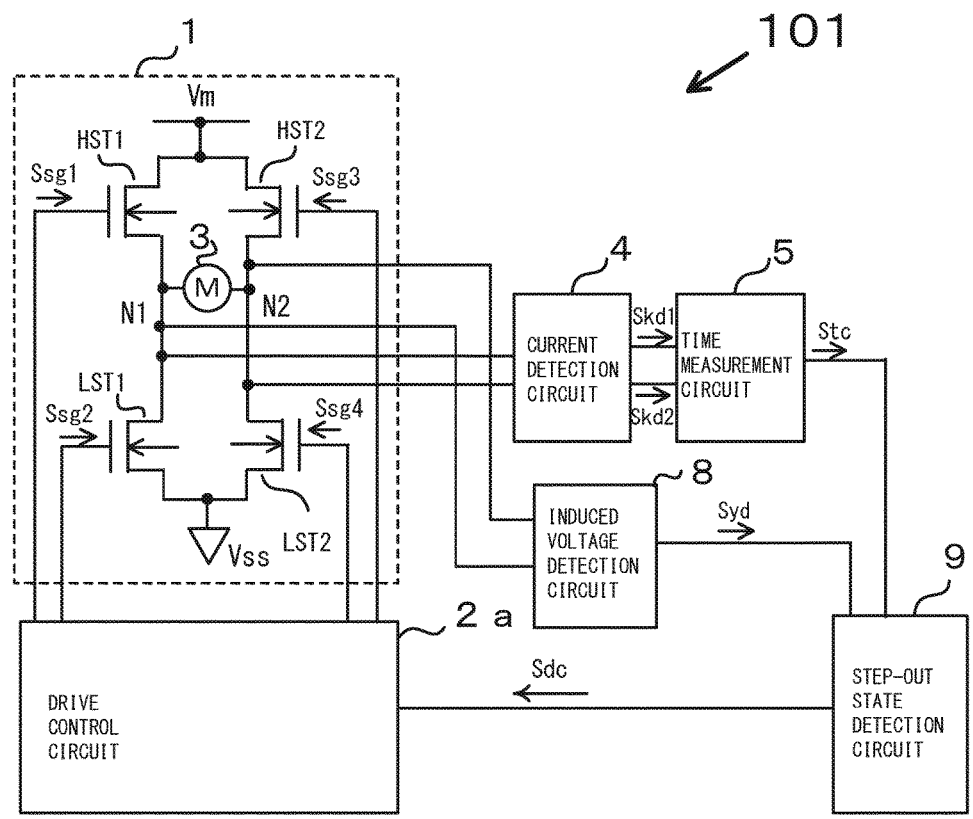
FIG. 12 is a circuit diagram showing a rotor position detection system according to a second embodiment.

A rotor position detection system according to a second embodiment will be described with reference to the drawings. FIG. 12 is a circuit diagram showing the rotor position detection system. In the present embodiment, a step-out state is detected based on the unit time dt (difference time) calculated by the time measurement circuit and the induced voltage.

Hereinafter, the same component portions as those in the first embodiment will be denoted by the same reference numerals, the description of those portions will be omitted, and only different portions will be described.

As shown in FIG. 12, a rotor position detection system 101 includes the H bridge circuit 1, a drive control circuit 2a, the current detection circuit 4, the time measurement circuit 5, the induced voltage detection circuit 8, and a step-out state detection circuit 9. The rotor position detection system 101 drives and controls the motor 3 and detects a step-out state of the motor.

The step-out state detection circuit 9 receives the calculation signal Stc (unit time dt (difference time)) output from the time measurement circuit 5 and the detection signal Syd (induced voltage) output from the induced voltage detection circuit 8, and in an interval where the motor control current does not flow to the motor 3, observes information such as the voltage, the polarity, and the inclination of the induced voltage to detect a step out state. The step-out state detection circuit 9 outputs a step-out information signal Sdc to the drive control circuit 2a.

The drive control circuit 2a drives and controls the H bridge circuit 1. The drive control circuit 2a controls the motor control current based on the step-out information signal Sdc so as to restore the motor from the step-out state to a normal state.

As described above, in the rotor position detection system 101 of the present embodiment, the H bridge circuit 1, the drive control circuit 2a, the current detection circuit 4, the time measurement circuit 5, the induced voltage detection circuit 8, and the step-out state detection circuit 9 are provided. The step-out state detection circuit 9 detects a step-out state in a section where the motor control current does not flow to the motor 3 from the calculation signal Stc (unit time dt (difference time)) and the detection signal Syd (induced voltage).

Therefore, the motor can be restored from the step-out state to the normal state based on the detection result of the step-out state.

Figure 13:
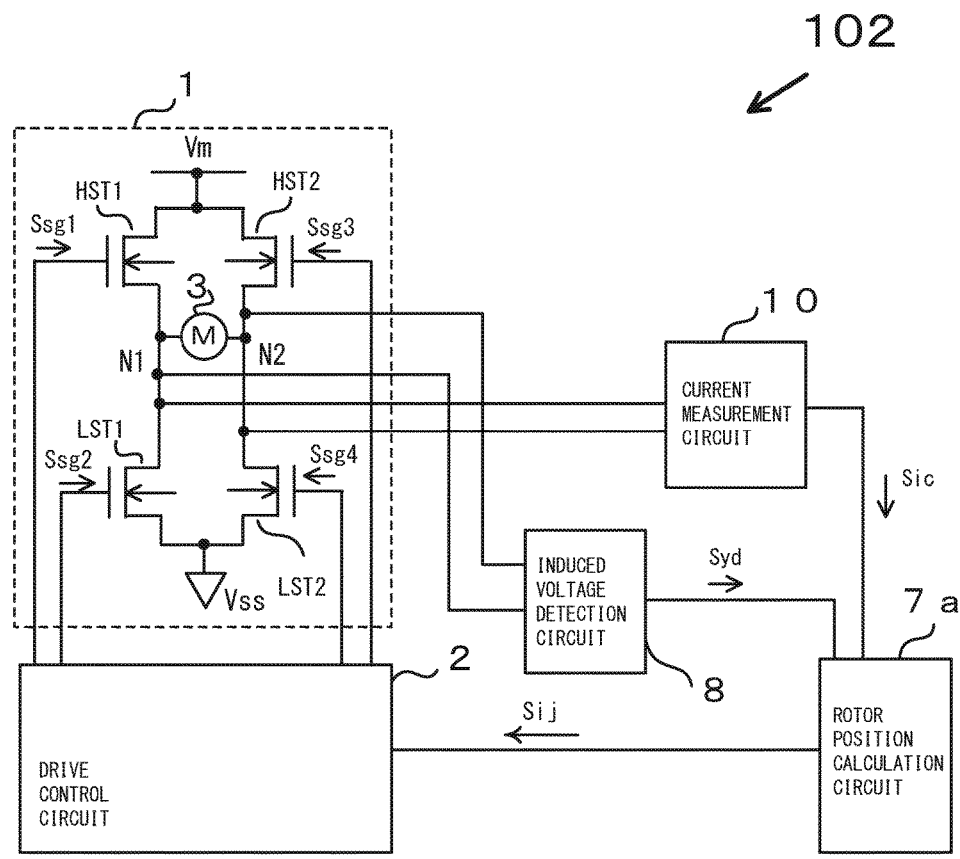
FIG. 13 is a circuit diagram showing a rotor position detection system according to a third embodiment.

A rotor position detection system according to a third embodiment will be described with reference to the drawings. FIG. 13 is a circuit diagram showing the rotor position detection system. In the present embodiment, by measuring a current flowing from the motor to the first low side transistor or the second low side transistor when the first and second high side transistors of the H bridge circuit are turned off and the first and second low side transistors or the H bridge circuit are turned on, a rotor position is calculated based on the measured current and the induced voltage.

Hereinafter, the same component portions as those in the first embodiment will be denoted by the same reference numerals, the description of those portions will be omitted, and only different portions will be described.

As shown in FIG. 13, a rotor position detection system 102 includes the H bridge circuit 1, the drive control circuit 2, a rotor position calculation circuit 7a, the induced voltage detection circuit 8, and a current measurement circuit 10. The rotor position detection system 102 drives and controls the motor 3 to calculate the rotor position.

When the high side transistors HST1 and HST2 are turned off and the low side transistors LST1 and LST2 are turned on, the current measurement circuit 10 measures a first current flowing from the motor 3 to the low side transistor LST1 in the operation state II→the operation state III shown in FIG. 4 (b), or a second current flowing to the low side transistor LST2 in the operation state I→the operation state III.

The rotor position calculation circuit 7a receives a current information signal Sic (current value information of the first current or the second current) output from the current measurement circuit 10 and the detection signal Syd (induced voltage) output from the induced voltage detection circuit 8, and calculates the rotor position to output the rotor position information signal Sij to the drive control circuit 2. The drive control circuit 2 controls the motor control current amount based on the rotor position information signal Sij.

As described above, in the rotor position detection system 102 according to the present embodiment, the H bridge circuit 1, the drive control circuit 2, the rotor position calculation circuit 7a, the induced voltage detection circuit 8, and the current measurement circuit 10 are provided.

Therefore, the rotor position can be detected even when the voltage, the polarity, and the inclination change to the wave height value and phase delay amount of the induced voltage.

Figure 14:
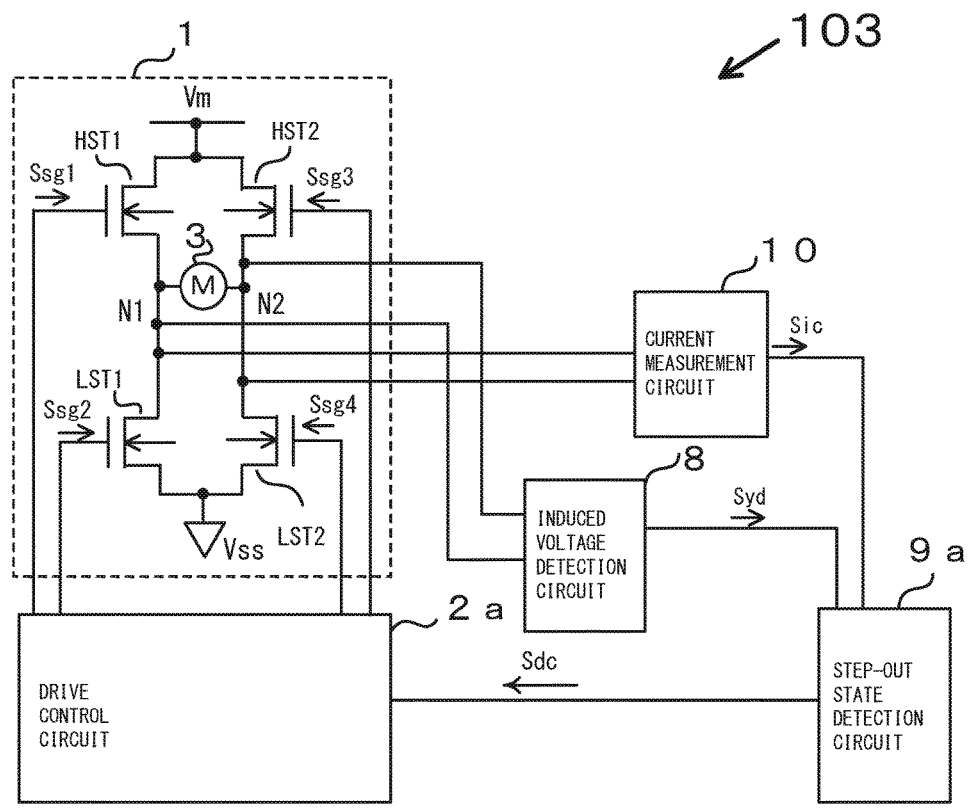
FIG. 14 is a circuit diagram showing a rotor position detection system according to a fourth embodiment.

A rotor position detection system according to a fourth embodiment will be described with reference to the drawings. FIG. 14 is a circuit diagram showing the rotor position detection system. In the present embodiment, by measuring a current flowing from the motor to the first low side transistor or the second low side transistor when the first and second high side transistors of the H bridge circuit are turned off and the first and second low side transistors of the H bridge circuit are turned on, a step-out state is detected based on the measured current and the induced voltage.

Hereinafter, the same component portions as those in the first embodiment will be denoted by the same reference numerals, the description of those portions will be omitted, and only different portions will be described.

As shown in FIG. 14, a rotor position detection system 103 includes the H bridge circuit 1, the drive control circuit 2a, the induced voltage detection circuit 8, a step-out state detection circuit 9a, and the current measurement circuit 10. The rotor position detection system 102 drives and controls the motor 3 to calculate the rotor position.

The step-out state detection circuit 9a receives the current information signal Sic (current value information of the first current or the second current) output from the current measurement circuit 10 and the detection signal Syd (induced voltage) output from the induced voltage detection circuit 8, and in an interval where the motor control current does not flow to the motor 3, observes information such as the voltage, the polarity, and the inclination of the induced voltage to detect a step out state. The step-out state detection circuit 9a outputs the step-out information signal Sdc to the drive control circuit 2a.

The drive control circuit 2a drives and controls the H bridge circuit 1. The drive control circuit 2a controls the motor control current based on the step-out information signal Sdc so as to restore the motor 3 from the step-out state to a normal state.

As described above, in the rotor position detection system 103 according to the present embodiment, the H bridge circuit 1, the drive control circuit 2a, the induced voltage detection circuit 8, the step-out state detection circuit 9a, and the current measurement circuit 10 are provided. The step-out state detection circuit 9a receives the current information signal Sic (current value information of the first current or the second current) and the detection signal Syd (induced voltage), and detects the step-out state of the motor 3.

Therefore, the motor can be restored from the step-out state to the normal state based on the detection result of the step-out state.

In the first to third embodiments, the first and second modifications, the rotor position detection system is explained using the drive control circuit, the current measurement circuit, the time measurement circuit, the zero cross determination circuit, the rotor position calculation circuit, the induced voltage detection circuit, the step-out state detection circuit, the current measurement circuit, and the like as the hardware configuration, but the invention is not necessarily limited to this. For example, some or all of the hardware functions may be incorporated in a central processing unit (CPU), a microcomputer, a processor or the like and handled by software processing or the like.

While certain embodiments have been described, these embodiments have been presented by way of example only, and are not intend to limit the scope of the inventions. Indeed, the novel embodiments described herein may be embodied in a variety of the other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A rotor position detection system comprising:
    an H bridge circuit having first and second high side transistors to control a direction and conduction of a current flowing through a coil of a motor, the first and second high side transistors being provided between a power supply and the motor, and first and second low side transistors provided between the motor and a ground potential;
    a current detection circuit configured to detect a current flowing from the motor to the first low side transistor or the second low side transistor when the first and second high side transistors are turned off and the first and second low side transistors are turned on, and convert a detected current into a voltage;
    a time measurement circuit configured to measure a first time until the detection voltage detected by the current detection circuit becomes lower than a first reference voltage, and a second time until the detection voltage becomes lower than a second reference voltage smaller than the first reference voltage, and calculate a difference time between the first time and the second time;
    a zero cross determination circuit configured to calculate a zero cross position of an induced voltage of the motor based on the difference time; and
    a rotor position calculation circuit configured to calculate a rotor position of the motor based on a zero cross position of the induced voltage.

2. The rotor position detection system according to claim 1, further comprising a drive control circuit configured to perform PWM control on the first and second high side transistors and the first and second low side transistors and control a motor control current amount based on rotor position information calculated by the rotor position calculation circuit.

3. The rotor position detection system according to claim 1, further comprising an induced voltage detection circuit configured to detect an induced voltage generated in the motor and output a detected induced voltage to the zero cross determination circuit.

4. The rotor position detection system according to claim 1, wherein the first reference voltage is a product of a micro step current value and an on resistance value of a low side transistor, and the second reference voltage is a product of a ripple amount of the micro step current and an on resistance value of the low side transistor.

5. The rotor position detection system according to claim 1, wherein the motor is a stepping motor including a first phase coil and a second phase coil.

6. The rotor position detection system according to claim 5, wherein the first phase coil is connected to a first H bridge circuit and the second phase coil is connected to a second H bridge having a configuration identical to the first H bridge circuit.

7. The rotor position detection system according to claim 1, wherein the time measurement circuit includes a first comparator, a second comparator, and a time calculation circuit,
    the first comparator receives an output signal of the current detection circuit at a plus port on an input side and the first reference voltage at a minus port on the input side and outputs a signal subjected to comparison operation processing, the second comparator receives an output signal of the current detection circuit at a plus port on an input side and the second reference voltage at a minus port on the input side and outputs a signal subjected to comparison operation processing, the time calculation circuit calculates a difference time between the first time and the second time based on the output signal of the first comparator and the output signal of the second comparator.

8. A rotor position detection system comprising:

an H bridge circuit having first and second high side transistors to control a direction and conduction of a current flowing through a coil of a motor, the first and second high side transistors being provided between a power supply and the motor, and first and second low side transistors provided between the motor and a ground potential;

an induced voltage detection circuit configured to detect an induced voltage generated at the motor;

a current detection circuit configured to detect a current flowing from the motor to the first low side transistor or the second low side transistor when the first and second high side transistors are turned off and the first and second low side transistors are turned on, and convert a detected current into a voltage;

a time measurement circuit configured to measure a first time until the detection voltage detected by the current detection circuit becomes lower than a first reference voltage, and a second time until the detection voltage becomes lower than a second reference voltage smaller than the first reference voltage, and calculate a difference time between the first time and the second time; and a step-out state detection circuit configured to detect a step-out state of the motor based on the induced voltage detected by the induced voltage detection circuit and the difference time calculated by the time measurement circuit.

9. The rotor position detection system according to claim 8, further comprising a drive control circuit configured to perform PWM control on the first and second high side transistors and the first and second low side transistors and control a motor control current amount based on rotor position information calculated by the rotor position calculation circuit.

10. The rotor position detection system according to claim 8, wherein the first reference voltage is a product of a micro step current value and an on resistance value of a low side transistor, and the second reference voltage is a product of a ripple amount of the micro step current and an on resistance value of the low side transistor.

11. The rotor position detection system according to claim 8, wherein the motor is a stepping motor including a first phase coil and a second phase coil.

12. The rotor position detection system according to claim 11, wherein the first phase coil is connected to a first H bridge circuit and the second phase coil is connected to a second H bridge having a configuration identical to the first H bridge circuit.

13. The rotor position detection system according to claim 8, wherein the time measurement circuit includes a first comparator, a second comparator, and a time calculation circuit, the first comparator receives an output signal of the current detection circuit at a plus port on an input side and the first reference voltage at a minus port on the input side and outputs a signal subjected to comparison operation processing, the second comparator receives an output signal of the current detection circuit at a plus port on an input side and the second reference voltage at a minus port on the input side and outputs a signal subjected to comparison operation processing, and the time calculation circuit calculates a difference time between the first time and the second time based on the output signal of the first comparator and the output signal of the second comparator.

14. A rotor position detection system comprising:

an H bridge circuit having first and second high side transistors to control a direction and conduction of a current flowing through a coil of a motor, the first and second high side transistors being provided between a power supply and the motor, and first and second low side transistors provided between the motor and a ground potential;

an induced voltage detection circuit configured to detect an induced voltage generated at the motor;

a current measurement circuit configured to measure a first current flowing from the motor to the first low side transistor or a second current flowing from the motor to the second low side transistor when the first and second high side transistors are turned off and the first and second low side transistors are turned on; and a rotor position calculation circuit configured to calculate a rotor position of the motor based on a current value of the first current or the second current and the induced voltage.

15. The rotor position detection system according to claim 14, further comprising a drive control circuit configured to perform PWM control on the first and second high side transistors and the first and second low side transistors and control a motor control current amount based on rotor position information calculated by the rotor position calculation circuit.

16. The rotor position detection system according to claim 14, wherein the motor is a stepping motor including a first phase coil and a second phase coil.

17. The rotor position detection system according to claim 16, wherein the first phase coil is connected to a first H bridge circuit and the second phase coil is connected to a second H bridge having a configuration identical to the first H bridge circuit.

* * * * *